United States Patent
Chu et al.

(10) Patent No.: US 6,294,435 B1
(45) Date of Patent: *Sep. 25, 2001

(54) METHOD OF REDUCING WORD LINE RESISTANCE AND CONTACT RESISTANCE

(75) Inventors: Huey-Chi Chu, Taipei; Jia-Ching Doong, Kaoshung; Chung-Pin Yang, Hsin-Chu, all of (TW)

(73) Assignee: Vanguard International Semiconductor Corporation, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/414,804

(22) Filed: Oct. 8, 1999

(51) Int. Cl.$^7$ ................................................ H01L 21/3215
(52) U.S. Cl. ........................... 438/305; 438/592; 438/660
(58) Field of Search .................................... 438/305, 592, 438/FOR 188, FOR 193, 660

(56) References Cited

U.S. PATENT DOCUMENTS

| | | | |
|---|---|---|---|
| 4,322,453 | 3/1982 | Miller | 427/89 |
| 5,364,803 | 11/1994 | Lur et al. | 437/40 |
| 5,384,285 | 1/1995 | Sitaram et al. | 437/200 |
| 5,389,575 | 2/1995 | Chin et al. | 437/190 |
| 5,393,685 | 2/1995 | Yoo et al. | 437/44 |
| 5,411,907 | 5/1995 | Yoo et al. | 437/44 |
| 5,558,910 | 9/1996 | Telford et al. | 427/255 |
| 5,593,924 | 1/1997 | Apte et al. | 437/200 |
| 6,040,238 | * 3/2000 | Yang et al. | |

* cited by examiner

Primary Examiner—George Fourson
Assistant Examiner—Joannie Adelle Garcia
(74) Attorney, Agent, or Firm—George O. Saile; Stephen B. Ackerman

(57) ABSTRACT

By introducing a carefully controlled anneal step after the deposition of tungsten silicide (onto a layer of polysilicon) but before the deposition of a layer of silicon oxide, interaction between the tungsten silicide and a subsequently deposited layer of silicon oxide is greatly reduced or eliminated. This gives good values for the resistance of gate lines formed from the composite as well as for the contact resistance between the polysilicon and the tungsten silicide.

12 Claims, 1 Drawing Sheet

METHOD OF REDUCING WORD LINE RESISTANCE AND CONTACT RESISTANCE

FIELD OF THE INVENTION

The invention relates to the general field of integrated circuits having a critical dimension in the sub micron range with particular reference to the use of tungsten silicide in conjunction with polysilicon to form gate lines and gate pedestals.

BACKGROUND OF THE INVENTION

As silicon integrated circuits continue to shrink, various changes in the materials and processes used need to be made. These changes are quite separate from modifications associated with ever finer photolithography. For example, polysilicon had long been used as the preferred material for forming the gate pedestal in an FET device. As long as devices were relatively large (critical dimension greater than 0.5 micron) the resistivity of polysilicon was low enough so that additional circuit lines such as the gate line in a DRAM could be made using the same polysilicon layer as was used for the formation of the gate.

Once the critical dimension dropped below about 0.5 microns, it was found that the resistance of gate lines of pure polysilicon was too high. As a result, the use of tungsten silicide as an overlay over the polysilicon was introduced. In the prior art the standard practice has been to follow the deposition of the tungsten silicide with deposition of a layer of silicon oxide. This combination of silicon oxide, tungsten silicide, and polysilicon is then heated to a temperature of about 900° C. in order to reduce the resistivity of the tungsten silicide.

The critical dimension of integrated circuits is now about 0.25 microns, or less. One consequence of these reduced dimensions has been the appearance of a new problem that is illustrated schematically in FIG. 1. What is shown is a silicon substrate 11 on whose surface is a layer of gate oxide 13 between two regions 12 of field oxide (FOX). Polysilicon layer 14 was deposited over the gate oxide followed by tungsten silicide layer 15 and silicon oxide layer 17. After the heat treatment described above, it was found that the resistance of gate lines formed from this composite was too high as was the contact resistance between layers 14 and 15.

Careful cross-sectioning of the structure revealed the presence of star like defects at the interface between the tungsten silicide and the silicon oxide. These are shown schematically as Xs such as 16. It thus appeared that during the anneal process some sort of reaction was occurring between the silicon oxide and tungsten silicide thereby reducing the effective thickness of the latter as well as placing a non-conductive layer between polysilicon and tungsten silicide. The present invention teaches a method for using tungsten silicide in conjunction with polysilicon but without the introduction of the defect layer shown in FIG. 1.

Since, as will be seen, the present invention involves a relatively small, but nevertheless critical, departure from prior art practices, the patent literature was carefully searched to ascertain whether or not the present invention had been anticipated. While a number of references were found that teach variations of the prior art process described above, none that embody the exact process of the present invention were discovered.

Several of the references that were found were, however, considered to be of interest. For example, in U.S. Pat. No. 5,411,907, Yoo et al show a poly/WSi gate with an anneal at at least 850° C. However, the anneal step takes place after the deposition of the top layer of silicon oxide. Less than 40 minutes of anneal time is recommended.

In U.S. Pat. No. 5,558,910, Telford et al., a specific process for depositing tungsten silicide is described in some detail and mention is made of annealing the film after its deposition. However, this anneal is not followed by the deposition of an overlayer of silicon oxide so the effect of a subsequently deposited layer of silicon oxide cannot be known. They perform their anneal at 900° C. in $N_2$ for 30 minutes to reduce resistivity and eliminate peeling.

In U.S. Pat. No. 5,393,685, Yoo uses an RTA at a temperature in excess of 1,000° C. for 30 to 60 minutes. As with the later Yoo patent mentioned above, the top layer of silicon oxide is in place during the anneal.

In U.S. Pat. No. 5,384,285, Sitaram et al. show a poly gate with a transition metal that is annealed at 600 to 700° C. to form a silicide layer while in U.S. Pat. No. 5,593,924, Apte shows a Ti silicide anneal at 600 to 900° C. to lower the resistivity. In U.S. Pat. No. 5,389,575 Chin et al. show a poly/silicide (e.g., TiSi or WSi) gate which is ion implanted with $N_2$ to reduce resistivity while Miller (U.S. Pat. No. 4,322,453) shows a WSi anneal at temperatures up to 1000° C. and higher. In U.S. Pat. No. 5,364,803, Lur et al. show a poly/TiN/WSi gate with exposure to F-atoms and an anneal to 850 to 1150° C. for 10 to 60 minutes.

SUMMARY OF THE INVENTION

It has been an object of the present invention to provide a process for forming a gate line and gate pedestal (such as could be used in a DRAM) comprising a layer of polysilicon overcoated with layers of tungsten silicide and silicon oxide.

A further object of the invention has been that said process be particularly well-suited to devices having a critical dimension of 0.25 microns or less.

These objects have been achieved by introducing an anneal step over a limited temperature range after deposition of the tungsten silicide but before deposition of the silicon oxide. When this is done, interaction between the tungsten silicide and the subsequently deposited silicon oxide is greatly reduced or eliminated. Thus, good values for the resistance of the gate line and for the contact resistance between polysilicon and tungsten silicide are obtained.

DESCRIPTION OF THE PREFERRED EMBODIMENTS

While the process of the present invention will be described in the context of the manufacture of an integrated circuit, it will be understood by those skilled in the art that the process is more general and could be used for any situation demanding low resistance narrow lines comprising tungsten silicide over polysilicon.

Figure 1:
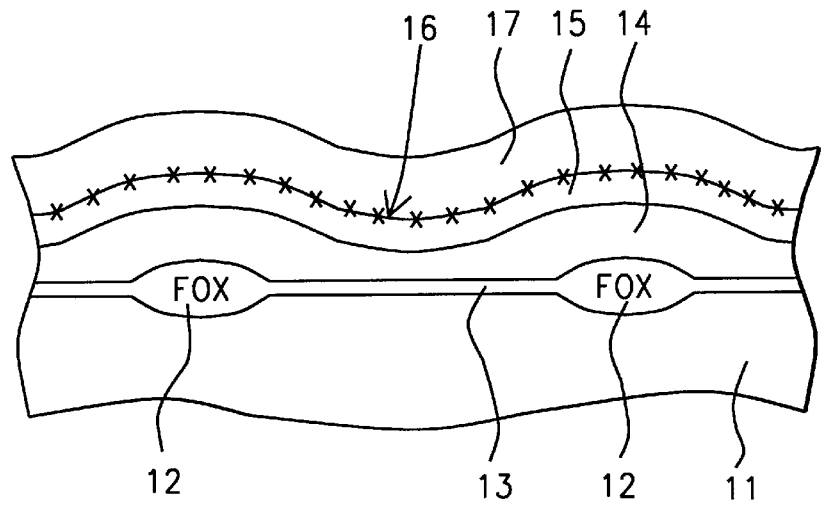
FIG. 1 is a schematic cross-section of a series of layers including polysilicon, tungsten silicide, and silicon oxide, showing the formation of defects at the tungsten silicide silicon oxide interface.
Figure 2:
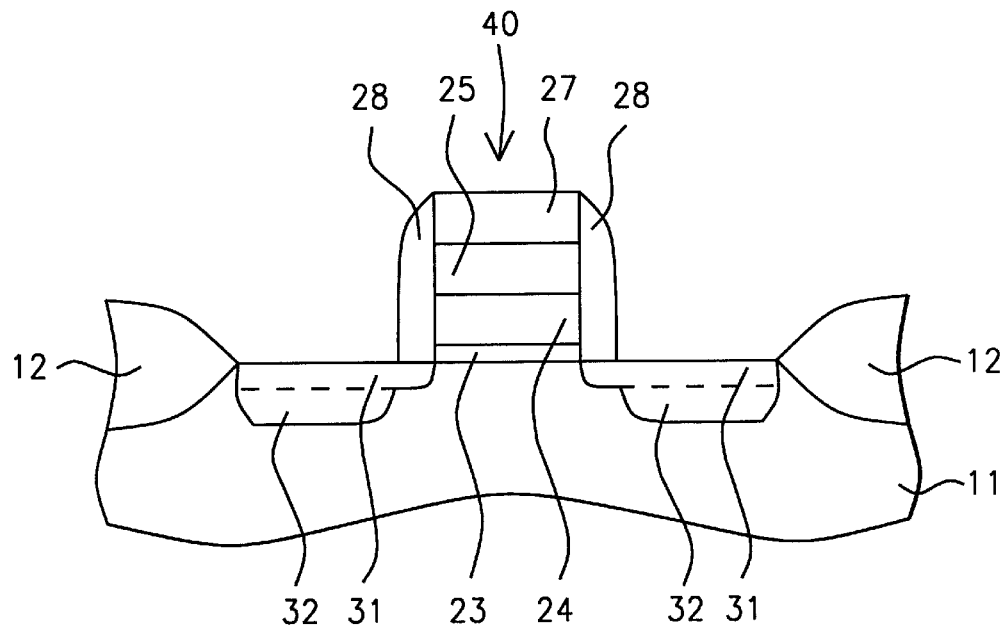
FIG. 2 is a cross-section of a lightly doped drain (LDD) structure made according to the teachings of the present invention.

The process begins with the provision of p-type silicon substrate 11 in FIG. 2. This is the case because the ensuing description will relate to an N channel device. The process would, however, work equally well if a P channel device were being manufactured.

A layer of gate oxide 23 is now formed on the substrate 11. The thickness of layer 23 is between about 1,800 and 2,200 Angstroms with about 2,000 Angstroms being preferred. Next, polysilicon layer 24 is deposited to a thickness between about 800 and 1,200 Angstroms, with about 1,000 Angstroms being preferred. This was followed by the deposition of tungsten silicide layer 25. This layer is between about 1,000 and 1,400 Angstroms thick, with about 1,200 Angstroms being preferred. In order to deposit the tungsten silicide the method used was sputtering but similar methods could also have been used.

In a key feature of the present invention the tungsten silicide/polysilicon was now annealed. Annealing took place in pure nitrogen. The anneal temperature needs to be in the range of between about 750 and 800° C., with about 800° C. being preferred, while the time of anneal should be between about 50 and 70 minutes with about 60 minutes being preferred. Note that these times and (particularly) these temperatures are critical for the success of this key step.

Following the anneal, silicon oxide layer 27 was then deposited. Most typically, layer 27 was TEOS (tetraethyl orthosilicate), but other sources of silicon oxide could also have been used. The thickness of layer 27 was between about 1,800 and 2,200 Angstroms with about 2,000 Angstroms being preferred.

With these layers now in place, formation of the device proper could proceed. The first step in forming the device was to pattern and etch layers 23, 24, 25, and 27 to form gate pedestal 40 and a gate line (running at right angles to the plane of the figure and therefore not shown). Gate pedestal 40 was now used as a mask while the surface of substrate 11 was implanted with donor ions, such as arsenic or phosphorus, to form source/drain regions 31. The energy of the ions was relatively low as was the implanted dose so that region 31 was fairly shallow and lightly doped.

Next, insulating spacers 28 (typically, but not necessarily, of silicon oxide) were grown on the vertical sidewalls of gate pedestal 40. With the spacers in place, the structure was subjected to additional ion implantation of donor ions. This time the ion energy and dose were higher than before so that implanted regions 32 were formed to a greater depth than 31 and to a higher implanted ion concentration. This results in the classic lightly doped drain structure.

Provided the annealing step was performed as described above, we found that our gate lines had a sheet resistance less than about 7.1 ohms per square and had a low contact resistance between the tungsten silicide and the polysilicon. This contrasted with much higher values that were found in devices formed using procedures currently known to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to reduce contact and line resistance, comprising the sequential steps of:

depositing a layer of polysilicon;

depositing a layer of tungsten silicide by sputtering;

annealing at a temperature between about 750 and 800° C. for between about 50 and 70 minutes;

depositing a layer of silicon oxide; and patterning and etching said layers whereby a tungsten silicide line in contact with a polysilicon gate pedestal is formed.

2. The method of claim 1 wherein the layer of polysilicon is deposited to a thickness that is between about 800 and 1,200 Angstroms.

3. The method of claim 1 wherein the layer of tungsten silicide is deposited to a thickness that is between about 1,000 and 1,400 Angstroms.

4. The method of claim 1 wherein said layer of silicon oxide is TEOS.

5. The method of claim 1 wherein the layer of silicon oxide has a thickness that is between about 1,800 and 2,200 Angstroms.

6. The method of claim 1 wherein the gate line has a sheet resistance that is less than about 7.1 ohms per square.

7. A process for reducing resistance and contact resistance of a word line in a DRAM structure, comprising the sequential steps of:

providing a p-type silicon substrate;

forming a layer of gate oxide on said silicon substrate;

depositing a layer of polysilicon on said layer of gate oxide;

by sputtering, depositing a layer of tungsten silicide on said layer of polysilicon;

annealing at a temperature between about 750 and 800° C. for between about 50 and 70 minutes;

depositing a layer of silicon oxide over the layer of tungsten silicide;

patterning and etching said layers whereby a gate line and a gate pedestal having vertical sidewalls are formed;

implanting donor ions into the silicon substrate using said gate pedestal as a mask, to a first depth and to a first implanted ion concentration;

forming insulating spacers on said vertical sidewalls of the gate; and using said gate, including the spacers, as a mask, implanting donor ions into the silicon substrate to a second depth, greater than said first depth, and to a second implanted ion concentration, greater than said first concentration, thereby forming a lightly doped drain structure having low contact resistance between said gate line and said gate pedestal.

8. The process of claim 7 wherein the layer of polysilicon is deposited to a thickness that is between about 800 and 1,200 Angstroms.

9. The process of claim 7 wherein the layer of tungsten silicide is deposited to a thickness that is between about 1,000 and 1,400 Angstroms.

10. The process of claim 7 wherein said layer of silicon oxide is TEOS.

11. The process of claim 7 wherein the layer of silicon oxide has a thickness that is between about 1,800 and 2,200 Angstroms.

12. The process of claim 7 wherein the gate line has a sheet resistance that is less than about 7.1 ohms per square.

* * * * *